US009997315B2

(12) United States Patent
Shimada (10) Patent No.: US 9,997,315 B2
(45) Date of Patent: Jun. 12, 2018

(54) SWITCH

(71) Applicant: Valeo Japan Co., Ltd., Saitama (JP)

(72) Inventor: Hiroyuki Shimada, Tokyo (JP)

(73) Assignee: Valeo Japan Co., Ltd. (JP)

( * ) Notice: Subject to any disclaimer, the term of this patent is extended or adjusted under 35 U.S.C. 154(b) by 139 days.

(21) Appl. No.: 14/877,608

(22) Filed: Oct. 7, 2015

(65) Prior Publication Data

US 2016/0181035 A1    Jun. 23, 2016

(30) Foreign Application Priority Data

Oct. 8, 2014    (JP) .................................. 2014-207446

(51) Int. Cl.
| *H01H 36/00* | (2006.01) |
| *H01H 36/02* | (2006.01) |
| *B60T 17/22* | (2006.01) |
| *H01H 9/02* | (2006.01) |
| *B60T 7/06* | (2006.01) |
| *B60Q 1/44* | (2006.01) |

(52) U.S. Cl.
CPC .............. *H01H 36/02* (2013.01); *B60T 7/06* (2013.01); *B60T 17/22* (2013.01); *H01H 9/02* (2013.01); *H01H 36/00* (2013.01); *H01H 36/002* (2013.01); *B60Q 1/441* (2013.01)

(58) Field of Classification Search
CPC ...................... H01F 36/00–36/02; B60Q 1/441
See application file for complete search history.

(56) References Cited

U.S. PATENT DOCUMENTS

| 4,316,145 A |   | 2/1982 | Tann |
| 5,877,664 A | * | 3/1999 | Jackson, Jr. ....... H01H 36/0073 |
|             |   |        | 335/205 |
| 6,617,845 B1 |   | 9/2003 | Shafiyan-Rad |
|             |   | (Continued) | |

FOREIGN PATENT DOCUMENTS

| DE | 2011161 A1 | 9/1971 |
| FR | 2848936 A1 | 6/2004 |
| WO | WO8706656 A1 | 11/1987 |

OTHER PUBLICATIONS

European Search Report for App. No. EP15185355, dated Feb. 29, 2016, 3 pp.

(Continued)

*Primary Examiner* — Ramon M Barrera
(74) *Attorney, Agent, or Firm* — Fishman Stewart PLLC (57) ABSTRACT

A magnetic type switch may include a magnet having a magnetic pole face arranged to face a magnetic body provided in an object. A change in magnetic field due to a change in distance between the magnetic body and the magnet by an operation of the object may be detected to output a signal for indicating at lease one of a presence and an absence of the operation of the object. The switch may also include a casing in which the magnet may be disposed, where the casing may have a facing part between the magnet pole face of the magnet and the magnetic body. The switch may further include a protector member formed of a non-magnetic body having a predetermined thickness in a direction vertical to the magnetic pole face, where the protector member maybe attached to the casing to cover at least the facing part.

10 Claims, 4 Drawing Sheets

(56) References Cited

U.S. PATENT DOCUMENTS

7,936,242 B2 * 5/2011 Carpenter .......... H01H 36/0073
335/205
9,355,800 B2 * 5/2016 Henderson .......... H01H 36/004

OTHER PUBLICATIONS

English Abstract for FR2848936A1.
Bibliographic Data Sheet indicating No Abstract Available for DE2011161A1.

* cited by examiner

SWITCH

CROSS-REFERENCE TO RELATED APPLICATIONS

This application claims priority to Japanese Patent Application No. 2014-207446, filed on Oct. 8, 2014, the disclosure of which is incorporated by reference herein in its entirety.

TECHNICAL FIELD

The present invention relates to a magnetic type switch that detects a position of a detected element without contact therewith.

BACKGROUND

A magnetic type switch is more superior in a point where there occurs no degradation in the switch due to contact with a detection object because of detecting a position of the detection object without contact therewith as compared to a conventional switch that detects a position of a detection object by making contact with the detection object, and there are various kinds of application examples of this magnetic type switch to various types of switches for vehicles (for example, refer to Japanese Patent Laid-Open Publication No. 2012-251809)

A magnetic type switch that detects an operation of a brake pedal is designed such that a magnet in the switch is provided to face a magnetic body attached to the brake pedal, and the magnetic type switch outputs an ON/OFF signal that indicates presence/absence of the operation of the brake pedal by detecting a change of magnetic field at the time a distance between the magnetic body and the magnet changes by the operation of the brake pedal.

Since a vehicular brake pedal that a driver operates with the driver's foot is arranged under the driver's foot, a switch that detects an operation of the brake pedal is also arranged under the driver's foot.

Therefore there are some cases where iron sand contained in the sand attached on driver's shoes or the like is pulled in by a magnetic force of the magnet to be attached on a surface of the switch. In this case, because of a change in magnetic field due to the attached iron sand, there occurs possibly a problem in detection of the operation of the brake pedal.

Accordingly, the magnetic field by the magnet in the magnetic type switch is required to be not subjected to an influence by an external factor such as iron sand.

SUMMARY

The present invention is made in view of the aforementioned problem, and an object of the present invention is to provide a magnetic type switch in which magnetic field of a magnet is not subjected to an influence of an external factor.

According to the present invention, a magnetic type switch in which a magnetic pole face of a magnet is arranged to face a magnetic body provided in an object, and a change in magnetic field due to a change in distance between the magnetic body and the magnet by an operation of the object is detected to output a signal for indicating presence/absence of the operation of the object, characterized in that the magnetic pole face of the magnet is arranged to face the magnetic body to have a facing part to the magnetic body between the magnetic pole face and the magnetic body within a casing of having the facing part, and a protector member formed of a non-magnetic body having a predetermined thickness in a direction vertical to the magnetic pole face is attached to the casing to cover at least the facing part with the protector member.

Since magnetic force lines extend in the vertical direction to the magnetic pole face, when the magnetic type switch is structured as described above, the protector member results in being positioned in a section where density of the magnetic force lines is the highest.

Then, the iron sand pulled in by the magnetic force of the magnet cannot be closer to the magnet than the protector member, and the pulled-in iron sand cannot be magnetized or even if it is magnetized, magnetic susceptibility thereof becomes low.

As a result, in the magnetic type switch of the present invention, which is different from a case where the protector member is not provided, since the pulled-in iron sand does not achieve a function as a magnet to collect a great deal of iron sand in a chained manner, the magnetic field of the magnet in the magnetic type switch is not affected by the iron sand or the like.

BRIEF DESCRIPTION OF THE DRAWINGS

Other objects, features, and advantages of the present invention will become more apparent from the following detailed description made with reference to the accompanying drawings, in which like parts are designated by like reference numbers and in which.

DETAILED DESCRIPTION

Hereinafter, a magnetic type switch according to an embodiment of the present invention will be described with reference to the accompanying drawings.

Figures 1A, 1B, 1C:
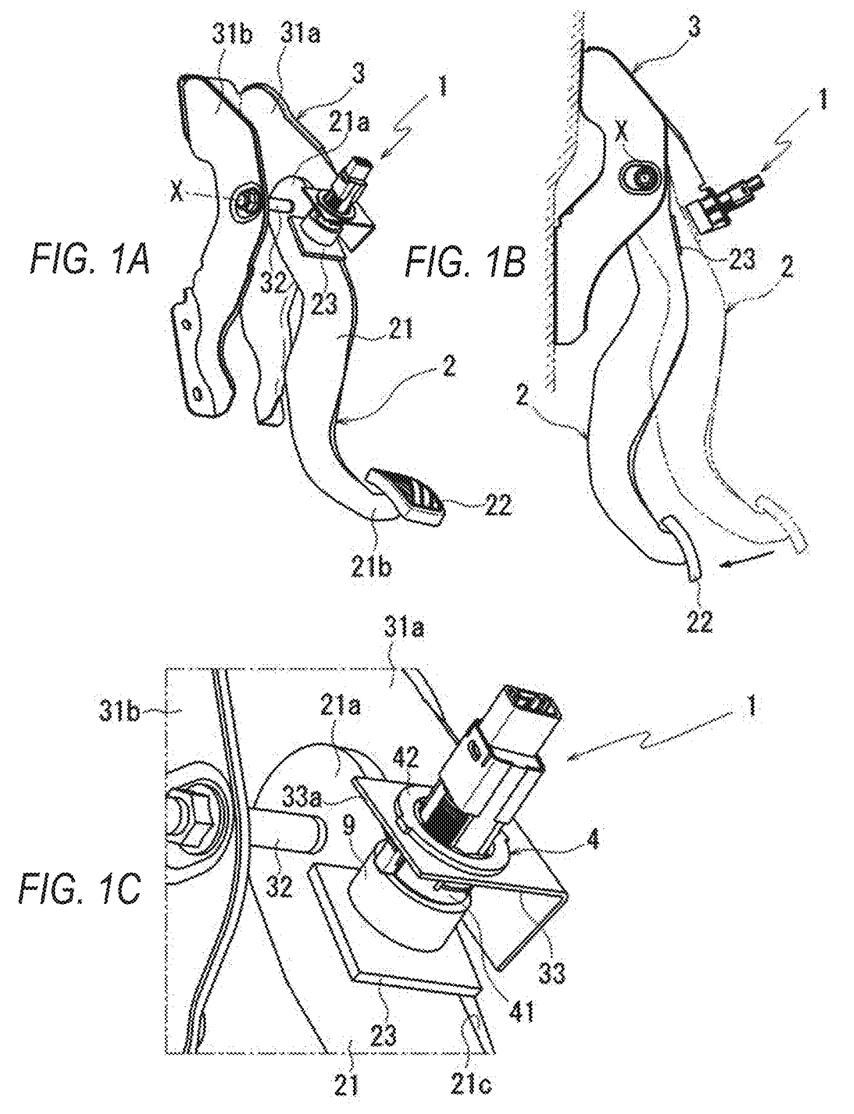
FIG. 1A is a perspective view illustrating a magnetic type switch according to an embodiment in the present invention.
FIG. 1B is a side view illustrating the magnetic type switch according to the embodiment.
FIG. 1C is an enlarged view illustrating the surroundings of the magnetic type switch in FIG. 1A.
Figures 2A, 2B, 2C:
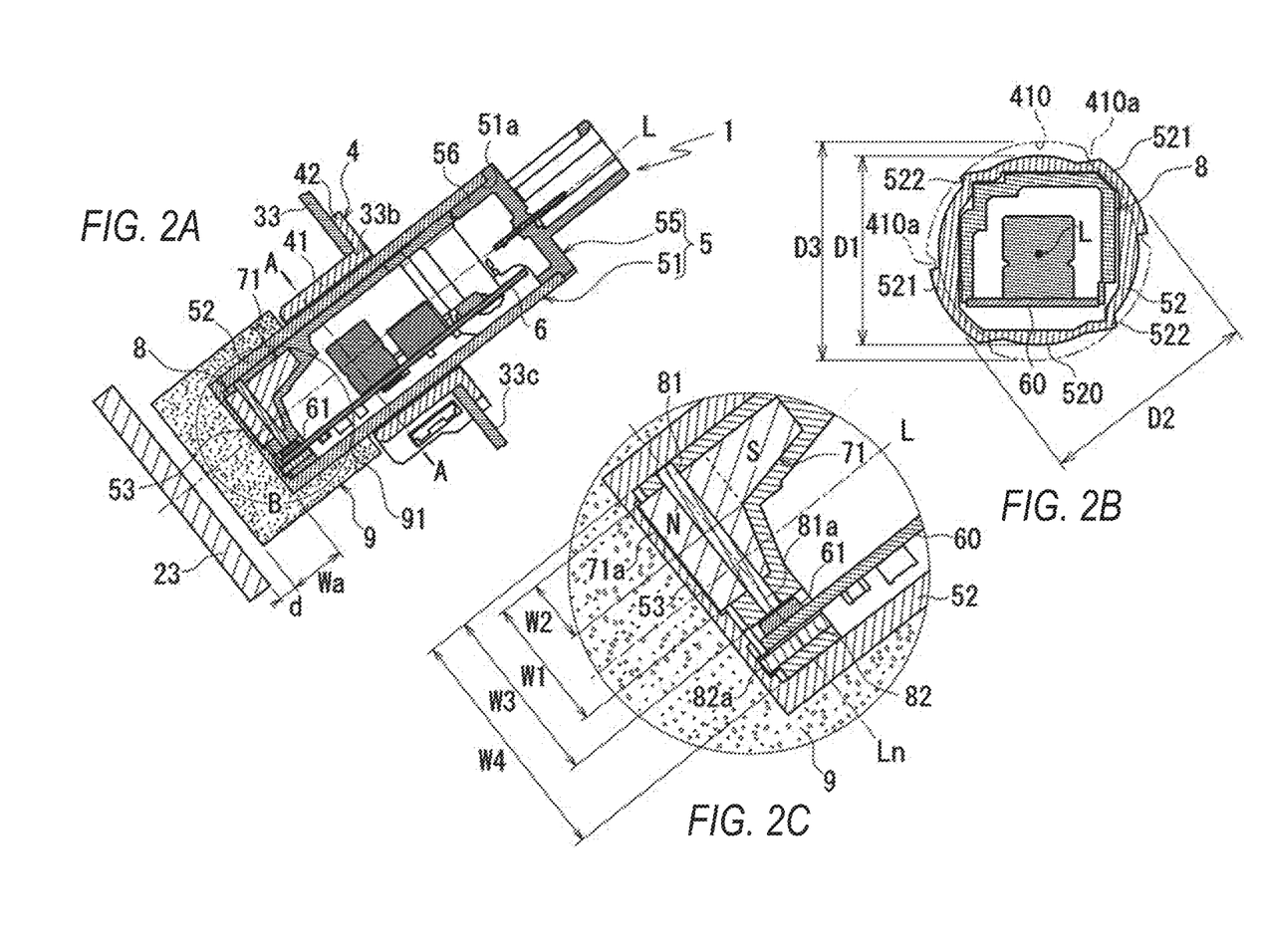
FIG. 2A is a sectional view illustrating the magnetic type switch according to the embodiment.
FIG. 2B is a sectional view taken along line A-A in FIG. 2A.
FIG. 2C is an enlarged view illustrating Region B in FIG. 2A.

FIG. 1A to FIG. 1C are diagrams each explaining an installation state of a magnetic type switch 1 that outputs a signal for indicating presence/absence of an operation of a brake pedal 2, wherein FIG. 1A is a perspective view illustrating the switch 1, FIG. 1B is a side view thereof and FIG. 1C is an enlarged view illustrating the surroundings thereof. FIG. 2A is a sectional view illustrating the surroundings of the switch 1, FIG. 2B is a sectional view taken along line A-A in FIG. 2A and is a diagram illustrating an inner periphery 410 of a tubular part 41 in a clip 4 in a virtual line, and FIG. 2C is an enlarged view of Region B in FIG. 2A.

As illustrated in FIG. 1A to FIG. 1C, a bracket 3 fixed on the vehicle body side (unillustrated) has side plates 31a, 31b that are arranged in parallel to each other to be spaced therebetween in the width direction. The side plate 31a and the side plate 31b are provided with a shaft member 32 that penetrates therethrough, the shaft member 32 supporting a brake pedal 2 to be rotatable thereon.

The brake pedal 2 is formed of a plate-shaped base part 21 one end 21a of which is rotatably supported by the shaft member 32, and an operating part 22 provided in the other end 21b that is capable of being displaced in the circumferential direction around a rotational axis X.

The base part 21 is made of magnetic material, and a stay 23 formed in a square shape as viewed from the compartment inside is provided in a side edge 21c in the compartment inside closer to the one end 21a-side of the base part 21. The stay 23 is made of ferromagnetic material such as iron and extends from the side edge 21c of the base part 21 to the side plate 31b-side along the rotational axis X direction.

A support plate part 33 of the switch 1 is provided in a position spaced from the stay 23 upward in the compartment inside. The support plate part 33 extends to the side plate 31b-side from a side edge, closer to the compartment inside, of the side plate 31a, and a tip 33a of the support plate part 33 is positioned closer to the side plate 31b than the stay 23.

As illustrated in FIG. 2A, the support plate part 33 is provided with a through hole 33b that penetrates through the support plate part 33 in the thickness direction, and a clip 4 for attaching the switch 1 on the support plate part 33 is fitted in the through hole 33b for fixation.

The clip 4 has a tubular part 41 that is inserted in the through hole 33b and a collar part 42 that surrounds one end of the tubular part 41 over an entire circumference.

The clip 4 is structured such that when the tubular part 41 is inserted in the through hole 33b until the collar part 42 abuts on a face 33c, closer to the compartment inside, of the support plate part 33, an engaging part (unillustrated) provided on an outer periphery of the tubular part 41 makes pressure-contact with an inner periphery of the through hole 33b to prevent the clip 4 from dropping out of the support plate part 33.

As illustrated in a virtual line in FIG. 2B, screw groove parts 410a that project to the tubular part 41-inside are provided on an inner periphery 410 of the tubular part 41, and are provided in two locations to be spaced in the circumferential direction in a sectional view.

Screw grooves are provided along the circumferential direction on an inner periphery of the screw groove parts 410a, and at the time of supporting the switch 1 with the clip 4, meshing of screw parts 521 provided in a body casing 5 of the switch 1 with the screw grooves blocks the switch 1 from dropping out of the support plate part 33.

As illustrated in FIG. 2A, the body casing 5 of the switch 1 is formed of a bottomed, tubular accommodation part 51 and an enclosing part 55 that closes an opening 51a of the accommodation part 51, and a print board 6 having a hall element 61 and a magnet holding member 8 in a tip of which a magnet 71 is insert-molded are accommodated in the body casing 5.

The accommodation part 51 is formed of a tubular peripheral wall part 52 and a bottom wall part 53 that closes one end of the peripheral wall part 52 in the longitudinal direction, and the screw parts 521 meshing with the screw groove parts 410a of the aforementioned clip 4 are provided on the outer periphery of the peripheral wall part 52 in a position offset to the opening 51a-side from the bottom wall part 53 (refer to FIG. 2B).

As illustrated in FIG. 2B, an outer peripheral face 520 of the peripheral wall part 52 is formed in an arc shape along a virtual circle having a diameter D1 in a sectional view, and the screw parts 521 and projection parts 552 are provided alternately two by two on the outer peripheral face 520 to be spaced in the circumferential direction.

The outer diameter D1 of a section of the peripheral wall part 52 in which the screw part 521 and the projection part 552 are not provided is made smaller than an inner diameter D3 of the tubular part 41 of the aforementioned clip 4, and an outer diameter D2 of a section of the peripheral wall part 52 in which the screw part 521 and the projection part 552 are provided is formed in a diameter substantially aligned to an inner diameter D3 of the tubular part 41.

Therefore the accommodation part 51 of the switch 1 is designed to be capable of being inserted in the tubular part 41 of the clip 4 in a state where the screw groove part 410a and the screw part 521 in the circumferential direction around an axis line L of the peripheral wall part 52 are shifted in phase from each other. In addition, the accommodation part 51 is inserted into the tubular part 41 of the clip 4 to position the switch 1 in the axis line L direction, and thereafter, when the switch 1 (body casing 5) is rotated in the circumferential direction around the axis line L to mesh the screw part 521 with the screw groove part 410a, it prevents the switch 1 from dropping out of the support plate part 33 (clip 4) and from being shifted in position in the axis line L direction.

The magnet holding member 8 is designed to be inserted in the accommodation part 51 of the body casing 5 from the opening 51a-side in an axial direction of the axis line L passing through a center of the peripheral wall part 52.

The enclosing part 55 that closes the opening 51a of the accommodation part 51 has a tubular fitting wall 56 that is fitted in the peripheral wall part 52. When the opening 51a of the accommodation part 51 is enclosed by the enclosing part 55, the magnet holding member 8 inserted in the accommodation part 51 is pushed by the fitting wall 56 to hold a magnetic pole face 71a of the magnet 71 provided in the tip in a position close to the bottom wall part 53.

In this state, the magnetic pole face 71a of the magnet 71 faces the bottom wall part 53 to be slightly spaced from the bottom wall part 53.

In the embodiment, a width W1 of the magnetic pole face 71a of the magnet 71 is made smaller than a width W4 of the bottom wall part 53, and a facing position of the magnetic pole face 71a to the bottom wall part 53 is in one side from the axis line L (left, oblique, upward side in FIG. 2C).

In the other side from the axis line L (right, oblique, downward side in FIG. 2C), a first yoke 81 and a second yoke 82 that are insert-molded in the magnet holding member 8 are arranged to face with each other to be spaced from each other on an axis line Ln in parallel to the magnetic pole face 71a.

Figure 3A:
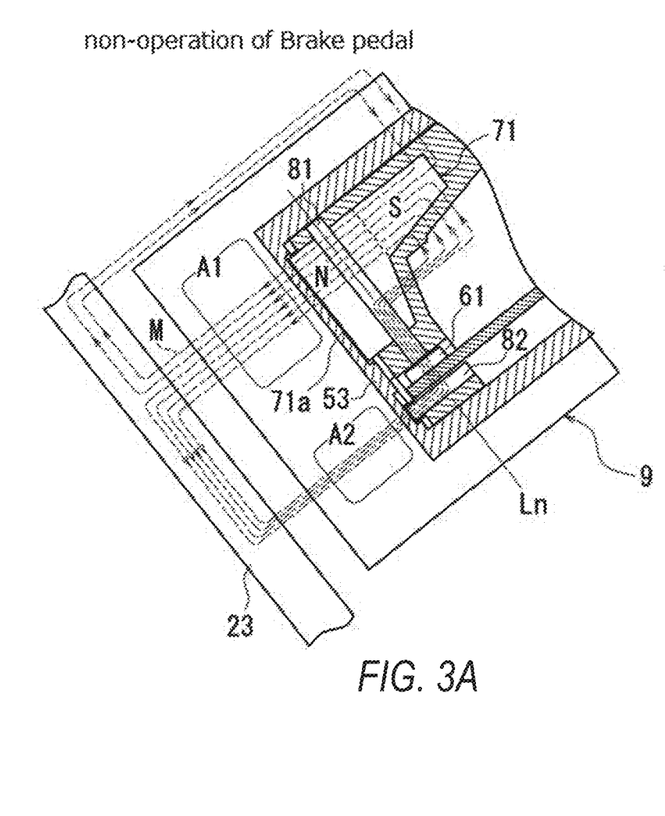
FIG. 3A is a diagram explaining a magnetic circuit by a magnet in the magnetic type switch according to the embodiment.

In the embodiment, the magnetic pole face 71a of the magnet 71 faces the bottom wall part 53 over its entire surface, and sections of magnetic lines M extending from the magnetic pole face 71a of the magnet 71, the sections being close to the magnetic pole face 71a, are aligned in a direction penetrating the bottom wall part 53 in the thickness direction (refer to FIG. 3A).

As illustrated in FIG. 2A to FIG. 2C, the magnet 71 has N pole in the bottom wall part 53-side and S pole in the enclosing part 55-side, wherein N pole is formed in a cubic shape having a predetermined width W1.

S pole positioned in the enclosing part 55-side of N pole is formed in a cube to have a connecting part to N pole having a width W2 narrower than N pole, and in a cubic shape such that the width is narrower according to being away from N pole.

The first yoke 81 in a square pillar shape is provided in parallel to the magnetic pole face 71a inside N pole, and one end part 81a of the first yoke 81 projects closer to the board 60 than the magnet 71, and faces a hall element 61 provided in the board 60.

The second yoke 82 embedded in the magnet holding member 8 by insert-molding is provided in the board 60 at the opposite to the hall element 61, and the first yoke 81 and the second yoke 82 oppose with each other to have the hall element 61 therebetween.

The second yoke 82 is provided in parallel to the axis line L passing through the center of the peripheral wall part 52, and is arranged such that an end face 82a of the second yoke 82 in the bottom wall part 53-side is flush with the magnetic pole face 71a of the magnet 71.

Therefore the magnetic pole face 71a of the magnet 71 and the end face 82a of the second yoke 82 each face the bottom wall part 53 to be slightly spaced from the bottom wall part 53, and in this state, the magnetic pole face 71a of the magnet 71 and the end face 82a of the second yoke 82 are positioned in the axis line L direction.

The stay 23 provided in the brake pedal 2 as described above is positioned in a position to be spaced from the bottom wall part 53 in a direction away from the magnet 71 along the axis line L. The stay 23 is positioned in the vicinity of the bottom wall part 53 of the body casing 5 at the non-operation of the brake pedal 2, and moves to a position away from the bottom wall part 53 at the operation of the brake pedal 2.

Figure 3B:
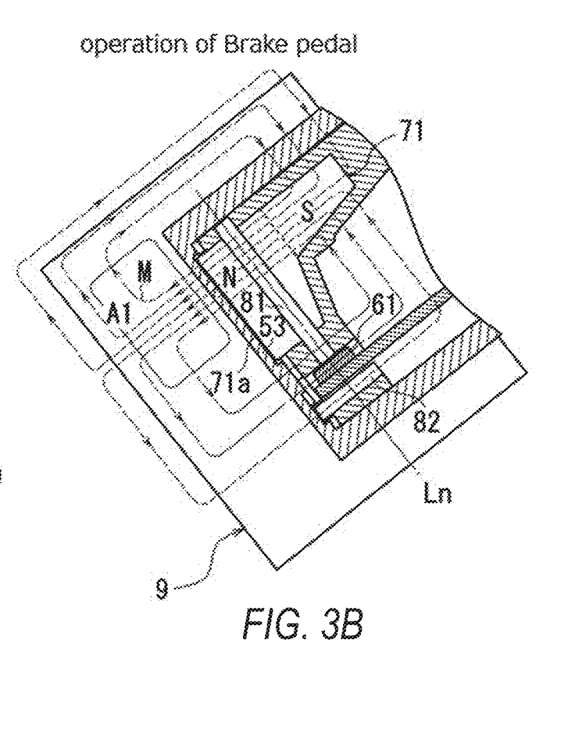
FIG. 3B is a diagram explaining a magnetic circuit by the magnet in the magnetic type switch.

FIG. 3A is a diagram explaining a magnetic circuit that is formed by the magnet 71 of the switch 1 in a case where the stay 23 is positioned in the vicinity of the magnetic pole face 71a of the magnet 71, and FIG. 3B is a diagram explaining a magnetic circuit that is formed by the magnet 71 in a case where the stay 23 is not positioned in the vicinity of the magnetic pole face 71a of the magnet 71.

When the brake pedal 2 is not operated, the stay 23 provided in the brake pedal 2 is positioned in the vicinity of the magnetic pole face 71a of the magnet 71, and in this state, the magnetic circuit as illustrated in FIG. 3A is formed.

Specifically the magnetic flux advancing in a direction of being away from the magnetic pole face 71a of the magnet 71 mostly passes through the stay 23 and goes toward the second yoke 82. Then, the magnetic flux having entered into the second yoke 82 goes across the hall element 61 to be led into the first yoke 81, and after that, goes from N pole to S pole in the magnet 71.

In the embodiment, a passing direction of the magnetic flux in the hall element 61 at this time is set to be along a magnetic sensitive direction, and density of the magnetic flux detected by the hall element 61 becomes a large value.

On the other hand, when the brake pedal 2 is operated, the stay 23 provided in the brake pedal 2 is away from the magnetic pole face 71a of the magnet 71, and as a result, magnetic flux from the magnetic pole face 71a cannot enter into the stay 23. In this state, the magnetic flux advancing in the direction of being away from the magnetic pole face 71a of the magnet 71 moves in a direction along the installation face of the hall element 61, and after that, finally enters into S pole in the magnet 71 (refer to FIG. 3B).

Since the flow of the magnetic flux is in direction vertical to the magnetic sensitive direction of the hall element 61, the density of the magnetic flux detected by the hall element 61 becomes zero.

In this manner, since the density of the magnetic flux detected by the hall element 61 changes depending upon whether or not the stay 23 is positioned in the vicinity of the magnetic pole face 71a of the magnet 71, the switch 1 outputs a signal for indicating ON/OFF of the brake pedal 2 based upon the detected density of the magnetic flux.

Further, the magnetic circuit formed around the magnet 71 in the switch 1 changes depending upon whether or not the stay 23 is positioned in the vicinity of the magnetic pole face 71a of the magnet 71.

Therefore in the embodiment, for preventing foreign objects made of magnetic material such as iron sand from being attached on the switch 1 by the magnetic circuit formed around the magnet 71 in the switch 1, a protector member 9 having cushion properties is attached on the bottom wall part 53-side of the body casing 5 in the switch 1.

As illustrated in FIG. 3A and FIG. 3B, the protector member 9 is disposed in a range of being capable of covering both of areas (areas A1, A2) where the density of the magnetic flux is high when the stay 23 is positioned in the vicinity of the magnetic pole face 71a of the magnet 71 and an area (area A1) where the density of the magnetic flux is high when the stay 23 is not positioned in the vicinity of the magnetic pole face 71a of the magnet 71.

It should be noted that in the embodiment, since the area where the density of the magnetic flux is high is formed in a direction vertical to the bottom wall part 53 arranged to face the magnetic pole face 71a of the magnet 71, the protector member 9 is designed to have a thickness Wa (refer to FIG. 2A) for preventing the iron sand having reached to the protector member 9 from being magnetized to the extent of being capable of pulling in other magnetic materials.

In addition, since there exist magnetic force lines M going around the lateral side of the magnet 71, in the embodiment the protector member 9 is provided with a peripheral wall part 91 to be capable of covering not only the bottom wall part 53 but also an outer periphery of the peripheral wall part 52 in the bottom wall part 53-side.

Figure 4A:
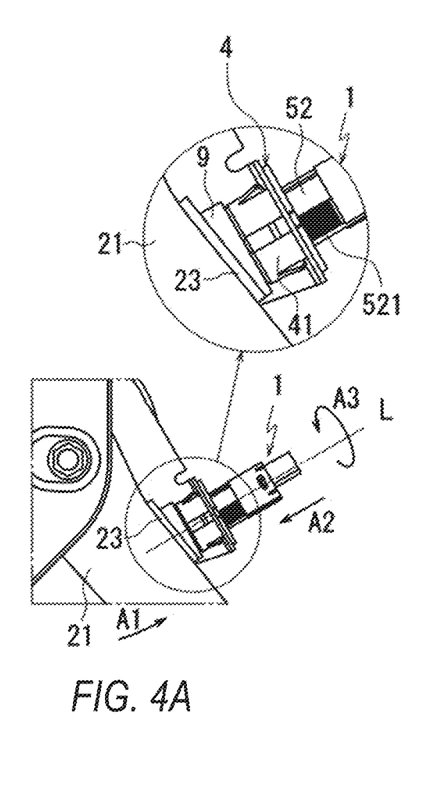
FIG. 4A is a diagram explaining a positional relation between a brake pedal and the magnetic type switch for explaining the positioning of the magnetic type switch according to the embodiment.
Figure 4B:
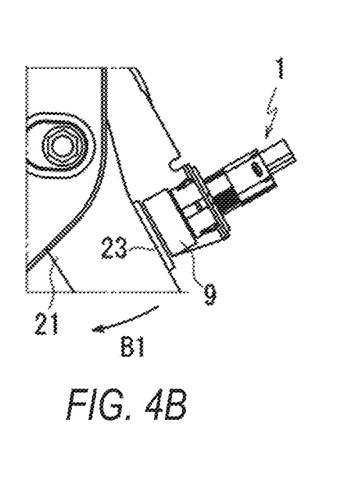
FIG. 4B is a diagram illustrating a positional relation between a stay and the magnetic type switch at the time the brake pedal is not operated.
Figure 4C:
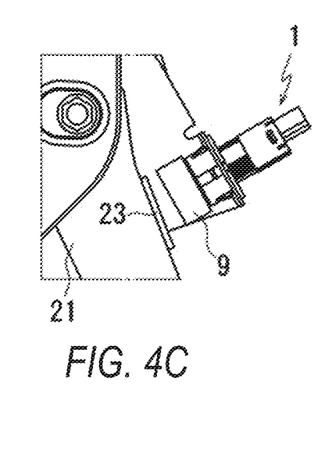
FIG. 4C is a diagram illustrating a positional relation between the stay and the magnetic type switch at the time the brake pedal is operated.

FIGS. 4A to 4C are diagrams explaining attachment of the switch 1 to the support plate part 33, wherein FIG. 4A is a diagram explaining a positional relation between the brake pedal 2 and the switch 1 for explaining the positioning of the switch 1 in the axis line L direction, FIG. 4B is a diagram indicating a positional relation between the stay 23 and the switch 1 when the brake pedal 2 is not operated, and FIG. 4C is a diagram indicating a positional relation between the stay 23 and the switch 1 when the brake pedal 2 is operated.

For positioning the switch 1 in the axis line L direction, the brake pedal 2 is rotated around the rotational axis X (refer to arrow A1 in FIG. 4A) to be arranged in a positioning initial position set closer to the compartment inside than a reference position indicated in FIG. 4B.

In this state, the accommodation part 51 of the switch 1 is inserted in the tubular part 41 of the clip 4 in a state where the screw part 521 (refer to FIG. 2B) provided on the peripheral wall part 52 in the switch 1 and the screw groove part 410a (refer to FIG. 2B) on the inner periphery of the tubular part 41 of the clip 4 are shifted in phase from each other around the axis line L (refer to arrow A2 in FIG. 4A).

In addition, in a point where the protector member 9 covering the bottom wall part 53 of the accommodation part 51 is compressed by the stay 23 of the brake pedal 2 to restrict insert of the switch 1 into the tubular part 41, the switch 1 is rotated around the axis line L to mesh the screw part 521 (refer to FIG. 2B) provided on the peripheral wall part 52 in the switch 1 and the screw groove part 410a (refer to FIG. 2B) on the inner periphery of the tubular part 41 of the clip 4 and restrict the movement of the switch 1 in the axis line L direction, thus positioning the switch 1 in the axis line L direction.

In the embodiment, for positioning the switch 1 in the axis line L direction, the bottom wall part 53 is designed to press the body casing 5 covered with the protector member 9 against the stay 23.

Here, since the protector member 9 is compressed between the stay 23 and the accommodation part 51 (body casing 5) at this positioning time, (1) when a compression amount of the protector member 9 varies, the switch 1 cannot be positioned with accuracy, and (2) after positioning the switch 1, when the shape of the protector member 9 is compressed and does not return back to the original, the iron sand pulled in by a magnetic force cannot be left away from the magnet 71. Therefore in the embodiment, the protector member 9 is made of a material that always has the same compression amount and has high resilience of the shape after the positioning.

As this material, a material that is a porous, non-magnetic material and has high resilience of the shape after the deformation, such as urethane foam, is used as the protector member 9.

When the positioning of the switch 1 in the axis line L direction is completed, the brake pedal 2 is rotated around the rotational axis X in a direction of separating the stay 23 from the switch 1 (refer to arrow B1 in FIG. 4B) by an urging force of an unillustrated spring to dispose the stay 23 in a predetermined position to have a gap d (refer to FIG. 2A) from the protector member 9 attached to the switch 1.

When the brake pedal 2 is operated in this state, the stay 23 of the brake pedal 2 moves in a direction of being away from the switch 1 to widen the gap between the stay 23 and the protector member 9. Thereby since the amount of the magnetic flux passing through the aforementioned hall element 61 (refer to FIG. 3A) is made small, the switch 1 outputs an ON signal of the brake pedal 2.

As described above, in the embodiment, the magnetic type switch 1 in which the magnetic pole face 71a of the magnet 71 is arranged to face the stay 23 (magnetic body) provided in the brake pedal 2 as an object, and a change in magnetic field due to a change in distance between the stay 23 and the magnet 71 by the operation of the brake pedal 2 is detected to output a signal for indicating presence/absence of the operation of the brake pedal 2, characterized in that the magnetic pole face 71a of the magnet 71 faces the stay 23 to have the bottom wall part 53 between the magnetic pole face 71a and the stay 23 in the accommodation part 51 of the body casing 5 having the bottom wall part 53 as the facing part to the stay 23, and the protector member 9 made of a non-magnetic body having the predetermined thickness Wa in a direction vertical to the magnetic pole face 71a is attached to the accommodation part 51 to cover at least the bottom wall part 53 with the protector member 9. When the foreign object of the magnetic body such as iron sand is pulled in by the magnetic force to be attached on the magnet, the object is magnetized to achieve a function as the magnet. Then, different iron sand is pulled in to the magnetized iron sand and is attached thereto, and this attached different iron sand is also magnetized to achieve a function of the magnet. Therefore the pulled-in iron sands are magnetized in turn to be connected, and as a result, many iron sands get together in a chained manner and are lined up along magnetic force lines extending from the magnetic force face of the magnet.

Here, as the density of the magnetic force lines gets higher, the magnetic force of pulling in the iron sand becomes the larger. Therefore many iron sands tend to be pulled in the vicinity of the magnetic pole face 71a on which the density of the magnetic force lines is high.

Accordingly, when the protector member 9 made of the non-magnetic body having the predetermined thickness Wa in the direction vertical to the magnetic pole face 71a is provided on the bottom wall part 53, the iron sand pulled in by the magnetic force can be appropriately prevented from getting together in a chained manner along the magnetic force line of the magnet 71.

As a result, in the embodiment, which is different from a case where the protector member 9 is not provided, since the pulled-in iron sand does not achieve a function as a magnet so that many iron sands get together in a chained manner, the magnetic field of the magnet 71 in the magnetic type switch 1 is not affected by the iron sand.

Therefore the detection accuracy (output accuracy) on presence/absence of the operation of the brake pedal 2 by the switch 1 improves.

Only by providing the protector member 9 on the bottom wall part 53 of the accommodation part 51 in the body casing 5, the attachment of the foreign object made of the magnetic body such as a magnet can be appropriately prevented. Therefore the attachment of the foreign object such as the iron sand on the body casing 5 in the switch 1 can be prevented without making the switch 1 large in size.

Further, since the protector member 9 is formed of a sponge-shaped member that achieves cushion properties and is made of porous, flexibly deformable material, it is possible to appropriately prevent the weight of the switch 1 from increasing due to the prevention of the attachment of the foreign object such as the iron sand on the body casing 5 in the switch 1.

Further, for positioning the switch 1 in the axis line L direction, since a material of the protector member 9 is determined in consideration of the elastic deformation of the protector member 9 and the positioning of the switch 1 can be performed with visual contact, it is not necessary to further set the process exclusive to the positioning of the switch 1.

In addition, when the operation of the brake pedal 2 is completed, the bake peal 2 returns back to the reference position by the urging force of the unillustrated spring. In the embodiment, by securing the gap d (refer to FIG. 2A) between the stay 23 of the brake pedal 2 arranged in the reference position and the protector member 9, the stay 23 does not interfere with the protector member 9 while the brake pedal 2 returns back to the reference position.

Here, when the stay 23 interferes with the protector member 9, the operation of the brake pedal 2 is repeated. As a result, there is a possibility that the protector member 9 is worn so that the iron sand pulled in by the magnetic force can reach to the vicinity of the magnet 71.

In this case, there is a possibility that the iron sand (magnetic body) pulled in by the magnetic force can be magnetized to achieve a function as the magnet, not to prevent the pulled-in iron sand from getting together in a chained manner along the magnetic force line of the magnet 71. In the embodiment, it is possible to prevent occurrence of this event since the gap d (refer to Fig. A) between the stay 23 and the protector member 9 is secured.

While only the selected embodiment has been chosen to illustrate the present invention, it will be apparent to those skilled in the art from this disclosure that various changes and modifications can be made therein without departing from the scope of the invention as defined in the appended claims. Furthermore, the foregoing description of the embodiment according to the present invention is provided for illustration only, and not for the purpose of limiting the invention as defined by the appended claims and their equivalents.

What is claimed is:

1. A magnetic type switch comprising:
a magnet having a magnetic pole face arranged to face a magnetic body provided in an object, wherein a change in magnetic field due to a change in distance between the magnetic body and the magnet by an operation of the object is detected to output a signal for indicating at least one of a presence and an absence of the operation of the object;
a casing in which the magnet is disposed, the casing having a facing part between the magnet pole face of the magnet and the magnetic body; and
a protector member formed of a non-magnetic body having a predetermined thickness in a direction vertical to the magnetic pole face, the protector member being attached to the casing to cover at least the facing part with the protector member;
wherein the protector member is formed of an elastic deformable material.

2. The magnetic type switch according to claim 1, wherein the magnet includes a north pole formed in a cubic shape having a predetermined width, and a south pole formed in a cubic shape having a width narrower than the width of the north pole.

3. The magnetic type switch according to claim 1, wherein the casing includes an accommodation part having an opening at an opposite end to the facing part, and an enclosing part to close the opening of the accommodation part.

4. The magnetic type switch according to claim 3, further comprising a support plate defining a through hole, and a clip having a tubular part inserted in the through hole of the support plate, a collar part that abuts a face of the support plate around the through-opening, and an engaging part provided on an outer periphery of the tubular part that makes press-contact with an inner periphery of the through hole to prevent the clip from dropping out of the support plate, wherein the clip is configured to engage with the accommodation part of the casing to prevent the casing from dropping out of the support plate.

5. The magnetic type switch according to claim 4, wherein the tubular part of the clip includes at least two screw groove parts on an inner periphery thereof, and the accommodation part of the casing includes at least two screw parts on an outer periphery thereof, such that the casing is capable of being inserted in the tubular part of the clip in a state where the screw groove parts and the screw parts in the circumferential direction are shifted in phase from each other, and when the casing is rotated, the screw parts and the screw groove parts mesh to prevent the casing from dropping out of the support plate.

6. The magnetic type switch according to claim 1, further comprising a print board having a hall element, and a magnet holding member in a tip of which the magnet is insert-molded.

7. The magnetic type switch according to claim 6, further comprising a first yoke and a second yoke inserted-molded in the magnet holding member, wherein the first yoke is in a square pillar shape and provided in parallel to the magnetic pole face, and has an end part that projects closer to the board than the magnet and faces the hall element, wherein the second yoke is provided in parallel to a longitudinal axis of the casing, and wherein the first yoke and the second yoke oppose each other with the hall element positioned therebetween.

8. A brake pedal assembly comprising:
a brake pedal having a base part, an operating part, and a magnetic body extending from the base part; and
a magnetic type switch, including:
a magnet having a magnetic pole face arranged to face the magnetic body of the brake pedal, wherein a change in magnetic field due to a change in distance between the magnetic body and the magnet by an operation of the brake pedal is detected to output a signal for indicating at least one of a presence and an absence of the operation of the brake pedal
a casing in which the magnet is disposed, the casing having a facing part between the magnet pole face of the magnet and the magnetic body; and
a protector member formed of a non-magnetic body having a predetermined thickness in a direction vertical to the magnetic pole face, the protector member being attached to the casing to cover at least the facing part with the protector member.

9. A magnetic type switch comprising:
a magnet having a magnetic pole face arranged to face a magnetic body provided in an object, wherein a change in magnetic field due to a change in distance between the magnetic body and the magnet by an operation of the object is detected to output a signal for indicating at least one of a presence and an absence of the operation of the object;
a casing in which the magnet is disposed, the casing having a facing part between the magnet pole face of the magnet and the magnetic body;
a protector member formed of a non-magnetic body having a predetermined thickness in a direction vertical to the magnetic pole face, the protector member being attached to the casing to cover at least the facing part with the protector member; and
a print board having a hall element, and a magnet holding member in a tip of which the magnet is insert-molded.

10. The magnetic type switch according to claim 9, further comprising a first yoke and a second yoke inserted-molded in the magnet holding member, wherein the first yoke is in a square pillar shape and provided in parallel to the magnetic pole face, and has an end part that projects closer to the board than the magnet and faces the hall element, wherein the second yoke is provided in parallel to a longitudinal axis of the casing, and wherein the first yoke and the second yoke oppose each other with the hall element positioned therebetween.

* * * * *